United States Patent [19]

Fukushima

[11] Patent Number: 5,038,196
[45] Date of Patent: Aug. 6, 1991

[54] SEMICONDUCTOR DEVICE

[75] Inventor: Jiro Fukushima, Itami, Japan

[73] Assignee: Mitsubishi Denki Kabushiki Kaisha, Japan

[21] Appl. No.: 515,696

[22] Filed: Apr. 25, 1990

Related U.S. Application Data

[63] Continuation of Ser. No. 156,019, Feb. 16, 1988 abandoned.

[30] Foreign Application Priority Data

Feb. 18, 1987 [JP] Japan ................................ 62-36264

[51] Int. Cl.$^5$ ..................... H01L 23/29; H01L 21/60
[52] U.S. Cl. ........................................ 357/73; 357/72; 437/209
[58] Field of Search ..................... 357/73, 72; 528/26; 437/209

[56] References Cited

U.S. PATENT DOCUMENTS 4,395,527 7/1983 Berger .................... 357/72
4,720,740 1/1988 Clements ................ 357/72

Primary Examiner—Mark Prenty
Attorney, Agent, or Firm—Leydig, Voit & Mayer

[57] ABSTRACT

A material which is rubber-like at room temperature and has excellent heat resistance and whose glass transition temperature is 0° C. or below is used as a die bonding material for securing a semiconductor chip to a lead frame. Since the heat shrinkage of the lead frame is not directly transmitted to the chip, it is possible to obtain a higly reliable semiconductor device which substantially overcomes the problem of chip warpage.

9 Claims, 1 Drawing Sheet

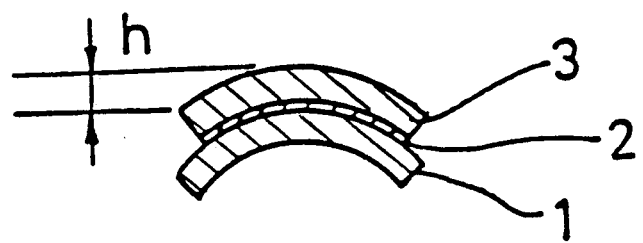

SEMICONDUCTOR DEVICE

This application is a continuation of application Ser. No. 07/156,019, filed Feb. 16, 1988 and now abandoned

BACKGROUND OF THE INVENTION

1. Field of the Invention

The present invention relates to a semiconductor device, and, more particularly, to a so-called die bonding material which is used to secure a semiconductor chip such as an IC chip to an island portion, that is the portion of a lead frame on which the semiconductor chip is mounted.

2. Description of the Related Art

At present, resin die bonding materials which are formed by adding a silver, silica, or alumina filler and the like to an epoxy resin or a polyimide resin for the purpose of improving the material's properties with respect to electrical conductance, heat transfer characteristics, mechanical characteristics and the like are used primarily for die bonding materials.

With respect to such a resin die bonding material, however, (1) it is necessary to cure the material at a high temperature of 150° to 400° C. In addition, (2) in a wire bonding process subsequent to die bonding, this material is further subjected to wire bonding at a high temperature of 250° to 350° C.

Consequently, since the aforementioned processes, particularly the process (2), involve high-temperature processing, the resin die bonding materials undergo heat deterioration due to the high temperature, and the resulting decomposed gas and the like adversely affect the reliability of the semiconductor device. Accordingly, the resin die bonding materials must excel in heat resistance so that such adverse effects can be eliminated.

In the case of a die bonding material using a polyimide resin, no particular problem exists in this respect since its molecular structure is rigid and it excels in heat resistance. In the case of an epoxy resin, however, it is necessary to cope with this problem by using one whose glass transition temperature Tg is set to at least 100° C. or above. Accordingly, a die bonding material using either of these resins is hard at room temperature, and this hard state of the resins continues up to a temperature range near the glass transition temperature Tg of the materials. Particularly in the case of the polyimide resin, the hard state continues up to a high temperature of about 300°–400° C.

With such a material, when the lead frame to which the chip is secured is cooled down to room temperature after die bonding or wire bonding at a high temperature, there are cases where the chip warps into a convex shape due to a bimetal effect. The occurrence of this warping phenomenon is attributable to the fact that, since the coefficient of thermal expansion of the lead frame is greater than that of the chip, in the case of a conventional hard die bonding material, the heat shrinkage of the lead frame is directly transmitted to the chip. This phenomenon occurs to a noticeable extent particularly when the lead frame is formed of a copper-based material.

If the chip thus undergoes deformation, fine cracks occur in a passivating film or the like present on the chip surface, presenting great problems in terms of the reliability of the semiconductor device. Particularly when the size of the chip is large and warping is extensive, breakage of the chip occurs, with the result that it becomes impossible to use the semiconductor device.

SUMMARY OF THE INVENTION

Accordingly, it is an object of the present invention to provide a highly reliable semiconductor device which can substantially alleviate the problems related to chip warping, thereby overcoming the above-described drawback of the prior art.

In order to achieve the object, according to an aspect of the present invention, there is provided a semiconductor device comprising a substrate, a semiconductor element and a die bonding material for securing the semiconductor element to the substrate, the material being rubber-like at room temperature and having excellent heat resistance.

In this invention, since a resin material which is rubber-like at room temperature and excels in heat resistance and which has a glass transition temperature of 0° C. or below is used as a die bonding material, the heat shrinkage of the lead frame is not directly transmitted to the chip. Therefore, it is possible to obtain a highly reliable semiconductor device which substantially overcomes the problems of chip warping.

BRIEF DESCRIPTION OF THE DRAWING

The present invention will be more readily apparent from the following detailed description of a few preferred embodiments thereof when taken in conjunction with the accompanying drawing, in which:

FIG. 1 is a cross-sectional view of an IC chip secured to a lead frame using a die bonding material in accordance with the present invention.

DESCRIPTION OF THE PREFERRED EMBODIMENTS

As a resin die bonding material used in a semiconductor device in accordance with the present invention, a thermosetting resin is preferable, and more particularly, a silicone resin, a fluorine-based resin (elastomer), and a phosphazene resin may be available. A typical formula of the phosphazene resin is shown below:

where R1 and R2 denote substituents.

Namely, in the present invention, since an elastomeric material which is rubber-like at room temperature and excels in heat resistance and which has a glass transition temperature of 0° C. or below is used, even in the case of a copper-based lead frame which undergoes a particularly large degree of thermal expansion and shrinkage, the extent of warping of the chip is very small even when it is cooled down to room temperature after completion of high-temperature processing during the thermosetting of the die bonding material in the die bonding process or the wire bonding process. Accordingly, since this material does not cause any damage to a passivating film or the like and excels in heat resistance, the decomposed gas resulting from the heat deterioration of the material causes practically no damage to the surfaces of the chip or the lead frame even during the wire bonding process at high temperature.

Thus, it is possible to obtain an excellent semiconductor device which presents no problems in terms of heat resistance, waterproof reliability characteristics and the like and which presents no problem in the practical use thereof.

In the resin die bonding material used in the present invention, similar to a conventional material, it is also possible to employ, as required, those physical property adjusting agents that are used in a conventional epoxy resin or polyimide resin composition, such as curing agents or curing catalysts, fillers such as silver, silica, and alumina powders, coupling agents for improving the bonding characteristics of an interface and ultrafine silica for adjusting the viscosity and thixotropy, thereby adjusting the electrical and mechanical properties and processing characteristics of the resin die bonding material.

A more detailed description of the present invention will now be given by way of working and comparative examples.

The measurement of chip warpage, evaluation of the external appearance thereof, and a pressure crack test (PCT) at 121° C. under 2 atmospheres of the semiconductor devices which were molded without being subjected to thermal cycling were conducted with respect to Examples of the semiconductor device in accordance with the present invention (Example 1 using a silicone resin die bonding material and Example 2 using a polyphosphazene resin die bonding material) and epoxy resin- and polyimide resin-based die bonding materials (Comparative Examples 1 and 2). The results obtained are shown in the table below. In the table, the amounts of chip warpage h (μm) and their external appearance obtained at room temperature after the specimens were allowed to cure under specified curing conditions are shown in the upper rows for each Example. The results obtained after the specimens were subjected to 50 cycles of a unit cycle of 150° C.×30 min. to −65° C.×30 min. are shown in the lower rows. In addition, the mark * indicates a specimen in which the amount of warpage decreased and the warping phenomenon was alleviated due to exfoliation and cracking of the chip; the mark O in the column for external appearance indicates no exfoliation; the mark Δ indicates small amounts of exfoliation; and the mark X indicates large amounts of exfoliation or chip cracking. Furthermore, the mark X in the column for PCT indicates a specimen in which the rejection rate after a lapse of 500 hours was 30% or more, while the mark O indicates one in which the rejection rate was 30% or less. Further, the chips used in the measurement of the amount of warpage and the evaluation of the external appearance were obtained by cutting crude wafers into specified dimensions, with a thickness of 0.4 mm.

In addition, the sole figure shows a cross-sectional view of a warped IC chip 3 secured to a lead frame 1 by means of a conventional die bonding material 2.

It will be readily appreciated from the results shown in the table that the semiconductor device in accordance with the present invention exhibits a very small amount of chip warpage after die bonding, with the result that no damage is caused to the passivating film on the chip surface, and in particular no adverse effect is caused relative to the waterproof reliability after molding. This substantially improves the reliability of the semiconductor device.

TABLE

| Die Bonding Material | | Item | | | | | | |
|---|---|---|---|---|---|---|---|---|
| | | Chip Warpage h (μm) Chip Size | | | External Appearance Chip Size | | | PCT equivalent to |
| | | 5 × 5 mm² | 5 × 10 mm² | 10 × 15 mm² | 5 × 5 mm² | 5 × 10 mm² | 10 × 15 mm² | 5 × 10 mm² |
| Example 1 | Silicone resin | 10 or less | 10~20 | 10~20 | O | O | O | O |
| | | 10 or less | 10~20 | 10~20 | O | O | O | |
| Example 2 | Polyphosphazene resin | 10 or less | 10~20 | 10~20 | O | O | O | O |
| | | 10 or less | 10~20 | 10~20 | O | O | O | |
| Comparative Example 1 | Epoxy resin (Tg ≈ 140° C.) | 10~20 | 50~60 | 80~100 | O | O | Δ | X |
| | | 10~20 | 20~30* | 20~30* | O | Δ | X | |
| Comparative Example 2 | Polyimide resin | 10~20 | 20~30* | 20~30* | O | X | X | X |
| | | 10~20 | 20~30* | 20~30* | Δ | X | X | |

What is claimed is:

1. A semiconductor device comprising:
   a substrate;
   a semiconductor element; and
   a heat resistant phosphazene resin bonding material that is rubber-like at room temperature securing said semiconductor element to said substrate.

2. A semiconductor device as claimed in claim 1 wherein said bonding material has a glass transition point of 0° C. or less.

3. A semiconductor device as claimed in claim 1 wherein said substrate is a lead frame.

4. A semiconductor device as claimed in claim 1 wherein said semiconductor element is an IC chip.

5. A semiconductor device as claimed in claim 1 wherein said bonding material contains a curing agent.

6. A semiconductor device as claimed in claim 1 wherein said bonding material contains a filler.

7. A semiconductor device as claimed in claim 6 wherein said filler includes at least one of silver, silica, and alumina powders.

8. A semiconductor device as claimed in claim 1 wherein said bonding material contains a coupling agent for improving bonding characteristics of said bonding material.

9. A semiconductor device as claimed in claim 1 wherein said bonding material contains ultrafine silica powder for adjusting the viscosity and thixotropy of said bonding material.

* * * * *